United States Patent [19]
Gordon et al.

[11] Patent Number: 4,620,132
[45] Date of Patent: Oct. 28, 1986

[54] ELECTRON BEAM SCANNABLE LED DISPLAY DEVICE

[75] Inventors: Eugene I. Gordon, Convent Station; Uri Levy, Berkeley Heights, both of N.J.

[73] Assignee: AT&T Bell Laboratories, Murray Hill, N.J.

[21] Appl. No.: 481,470

[22] Filed: Apr. 1, 1983

[51] Int. Cl.[4] .................... H01J 23/16; H01J 29/96
[52] U.S. Cl. ...................................... 315/3; 313/463; 313/501; 372/11; 372/24; 372/43; 331/94.1
[58] Field of Search .............. 315/1, 3; 313/463, 474, 313/496, 499, 501; 372/11, 24, 43, 44, 73, 74, 75; 331/94.1

[56] References Cited
U.S. PATENT DOCUMENTS

| | | | |
|---|---|---|---|
| 3,393,373 | 7/1968 | Stimler | 372/74 |
| 3,558,956 | 1/1971 | Basov et al. | 313/421 |
| 3,602,838 | 8/1971 | Stern | 372/43 |
| 3,636,471 | 1/1972 | Rediker | 313/499 |
| 3,803,510 | 4/1974 | Nicoll | 372/43 |
| 3,821,662 | 6/1974 | Dewinter et al. | 313/499 |
| 3,942,132 | 3/1976 | Zinn | 372/74 |
| 3,968,455 | 7/1976 | Yoder | 372/74 |
| 4,539,687 | 9/1985 | Gordon et al. | 372/43 |

OTHER PUBLICATIONS

"Formation of a Television Image with the Aid of a Laser Electron-Beam Tube Under Line Scanning Condition", by Kozlovskii et al, Sov. J. Quant. Electron, vol. 5, No. 7, 1980.

"Possible Use of Quantoscopes-New Devices with Electron-Beam-Scanned Semiconductor Lasers-in Large-Screen Color Projection Television Systems", by Grigor'ev et al, vol. 6, No. 3, pp. 279-282, 1980.

Primary Examiner—Saxfield Chatmon
Attorney, Agent, or Firm—Michael J. Urbano

[57] ABSTRACT

In a CRT display device the target comprises a multi-layered semiconductor including a p-n junction and at least one current-blocking layer. The e-beam is locally absorbed in the current-blocking layer so as to open a narrow zone which allows charge to flow through the forward biased p-n junction. The injection current produces a local spot of light which radiates from the opposite side of the device and whose position is varied by scanning the e-beam. In one embodiment the current-blocking layer is a semi-insulating semiconductor layer, and in another embodiment the current-blocking layer comprises the base of a normally cut-off transistor.

15 Claims, 3 Drawing Figures

ELECTRON BEAM SCANNABLE LED DISPLAY DEVICE

BACKGROUND OF THE INVENTION

This invention relates to display devices and, more particularly, to miniature cathode ray tubes (CRTs) which have semiconductor targets. These would be especially useful in projection display applications where high brightness is required.

In our co-pending patent application Ser. No. 453,577 filed on Dec. 27, 1982 now U.S. Pat. No. 4,539,687 issued on Sept. 3, 1985 we describe in considerable detail the development of the semiconductor laser CRT. In this device the target is a semiconductor which is scanned by the e-beam to generate a coherent light beam which radiates from the region of the semiconductor where the electrons are absorbed. The position of the light beam is varied by scanning the e-beam.

Generating light (radiative recombination of electrons and holes) directly by means of e-beam absorption, however, is not nearly as efficient as by means of current injection across a p-n junction. But localized current injection requires precisely defined electrodes and complex drive electronics. Consequently, it would be a formidable task to use such a method to address the necessary $10^5$-$10^6$ points in a two-dimensional, high resolution spatial pattern required for a display.

SUMMARY OF THE INVENTION

Our invention combines the desirable addressing properties of an e-beam with the efficient light generating properties of current injection. In one embodiment of our display device, the target comprises a broad area, multilayered semiconductor including a p-n junction and at least one current-blocking layer. Voltage is applied across the target such that the p-n junction would be forward biased were it not for the current-blocking layer. However, essentially all of the applied voltage appears across the blocking layer, and in the absence of an e-beam this layer prevents (or greatly reduces) the flow of charge across the p-n junction. Thus, virtually no light is generated and the target is dark. When an e-beam is made incident on one side of the target, however, it is absorbed in the current-blocking layer where it locally induces a high conductivity zone. Charge then flows through that zone and through the p-n junction. Consequently, a spot of light is generated by the radiative recombination of electrons and holes in the portion of the semiconductor in registration with the high conductivity zone. This spot radiates light from the other side of the semiconductor, and the position of the spot is scannable by scanning the e-beam.

For a given e-beam current density, this type of target is capable of much higher average spot brightness than conventional phosphor targets, particularly when the current-blocking layer is made to include relatively long lifetime electronic traps. These traps, as will be shown later, can give rise to charge gains of the order of $10^4$ and photon gains of the order of $10^6$.

In another embodiment of our invention the current-blocking layer is the base of a wide area transistor which is normally cut off. The e-beam turns on the transistor locally by depositing electrons in a localized zone of the base. The transistor gain provides a high injection current into the localized portion of the active layer under the e-beam.

BRIEF DESCRIPTION OF THE DRAWINGS

Our invention, together with its various features and advantages, can be readily understood from the following, more detailed description taken in conjunction with the accompanying drawing in which.

DETAILED DESCRIPTION

Figure 1:
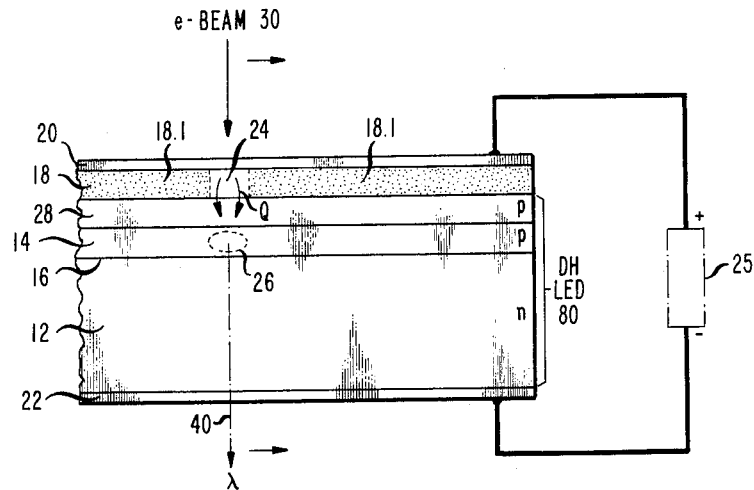
FIG. 1 is a schematic drawing of a semiconductor target for use in a CRT display device in accordance with one embodiment of our invention.

With reference now to FIG. 1, there is shown an illustrative embodiment of a multilayered semiconductor target 10 for use in a CRT display device. In a general sense, the target 10 includes p-n junction 16 and at least one current-blocking layer 18 interposed between the p-n junction 16 and the source of the e-beam 30. A pair of electrodes 20 and 22 are formed on opposite sides of the device, and a DC power supply 25 is connected thereacross so that the p-n junction 16 can be forward biased. The external power supply 25 should provide the necessary current to drive any number of target points (or picture elements) with a constant voltage across the target.

In operation, sufficient voltage is dropped across layer 18 so that, in the absence of e-beam 30, the p-n junction is not sufficiently forward biased and virtually no charge flows between the electrodes 20 and 22. As with conventional LEDs, at low currents the L-I characteristics is nonlinear and virtually no light is generated even with a small current; the target is therefore dark. However, when the e-beam 30 is incident on the electrode 20, the electrons penetrate through that electrode into the current-blocking layer 18 where they locally induce a zone 24 which has a higher conductivity than the adjacent regions 18.1 of layer 18. Consequently, charge Q is allowed to flow between the electrodes 20 and 22 through the zone 24. This flow of charge causes radiative recombination of electrons and holes in a portion 26 of the semiconductor beneath, and in substantial registration with, the zone 24. The source spot in portion 26 radiates light into $2\pi$ steradians. The light 40 emerges from the other side of the device and is scannable by scanning the e-beam 30. To this end, the bottom electrode 22 and the semiconductor material between the p-n junction 16 and the electrode 22 should be transparent at the wavelength $\lambda$ of the generated light.

An important feature of one embodiment of our invention is the provision of charge gain which for a given e-beam current enhances the brightness by providing long lifetime carrier traps in the current-blocking layer 18; that is, a trap lifetime $\tau$ which is long relative to the transit time T of carriers across layer 18 but short relative to the frame time (typically about 15–20 msec in most CRT systems) used for video display. Under these circumstances, charge gains $G_q = \tau/T$ of the order of $10^4$ can be realized with $\tau = 10$ msec and $T = 1$ $\mu$sec. Thus, the blocking layer 18 allows current or the flow of charge at any one spot 26 for a time period much longer than the time during which the e-beam 30 is addressing that spot. The associated light generated will also last a correspondingly longer time.

The function of traps in the blocking layer to provide charge gain can be understood as follows. In the blocking layer under no excitation (or very low excitation) the current density J through the layer of thickness d varies parabolically with the voltage V across the layer; i.e., $$J = \frac{9}{8} \frac{\epsilon \mu_o}{d^3} V^2 \tag{1}$$

provided that the mobility $\mu_o$ is independent of the electric field across the layer. In Eq. (1), $\epsilon$ is the dielectric constant of the layer. Note that Eq. (1) applies for current in one direction through the layer, and the negative of Eq. (1) applies for the opposite direction.

In contrast, under relatively high excitation (light or e-beam) the carrier density can be very large compared to the space charge density and varies linearly with voltage V; i.e., $$J = -\rho_o \mu_o (V/d) \tag{2}$$

where $\rho_o$, which is constant in space but not in time, is the density of the excited charge traps in the blocking layer and is frequently proportional to the square-root of the excitation power. Since $\rho_o$ depends on the trap lifetime $\tau$, the current and the linear J-V characteristic will last as long as the excited traps do. As $\rho_o$ decreases in time the $J \propto V^2$ characteristic defined by Eq. (1) will be restored.

Remembering that $\rho_o$ varies with the time t as $e^{-t/\tau}$ and integrating Eq. (2) in time gives the total charge Q flowing across the layer in the area A defined by the excitation beam:

$$Q = \rho_o d A (\tau/T). \tag{3}$$

Since $\rho_o d A$ is the initial charge produced by the excitation, then the charge gain $G_q$ is $$G_q = \tau/T. \tag{4}$$

For example, a typical low mobility semiconductor such as Cr-doped GaAs might have a mobility $\mu_o = 10^{-2}$ cm$^2$/sec-volt for which the transit time $T = 10^{-6}$ sec at $d = 1$ $\mu$m and $V = 1$ volt. For a trap lifetime $\tau = 10$ msec and $T = 1$ $\mu$sec, the charge gain is $10^4$. Given that $\epsilon \simeq 26.6 \times 10^{-12}$ Farad/m, substitution in Eq. (1) shows that the background (or leakage) current density is only about 3 mA/cm$^2$.

In contrast, a blocking layer made of a much higher mobility material (e.g., $\mu_o = 1$ cm$^2$/sec-volt) gives $T = 10$ nsec and $J = 300$ mA/cm$^2$ which is too high for practical applications. Therefore, it is clearly desirable that $\mu_o << 1$ cm$^2$/sec and $T >> 10$ nsec.

Although J-V characteristics corresponding to Eqs. (1) and (2) have been experimentally observed, the $J \propto V^2$ dependence of Eq. (1) may be closer to $J \propto V^3$ if the low current mobility is electric-field dependent. That is, if $\mu_o = mE$, where m is a constant, as in the case where electron drift is in the hopping mode, then $$J = -\left(\frac{64}{81}\right) \frac{m\epsilon}{d^4} V^3. \tag{5}$$

Figure 2:
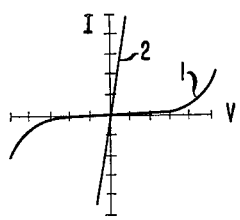
FIG. 2 is a graph of the current-voltage characteristics of a Cr-doped GaAs layer under no excitation (curve 1) and under relatively high excitation (curve 2)

More specifically, an experiment was performed utilizing photo-illumination of a 4.5 $\mu$m thick Cr-doped GaAs layer sandwiched between a 1 $\mu$m thick n$^{30}$-GaAs layer and a 15-20 mil thick n$^+$-GaAs substrate. Both the n$^+$-GaAs layer and substrate had suitable metallization. A sine wave ($-1$ volt peak) was applied across the sample and under no photo-illumination the I-V characteristic shown by curve 1 of FIG. 2 was observed. This characteristic approximates the V$^3$ dependence of Eq. (5). However, under relatively high illumination power (about 1 watt from a microscope illuminator) the I-V characteristic became that of curve 2 exhibiting a linear voltage dependence. When the illumination source was shut off, the I-V characteristic very slowly changed from that of curve 2 to that of curve 1 in a time period of about 10 seconds. This result confirms our prediction that charge continues to flow even after excitation has ceased. Moreover, the same results would be expected for e-beam excitation as for photo-illumination.

This phenomenon by which charge flows for a time longer than the e-beam excitation time is analogous to the situation of a conventional phosphor; that is, a phosphor produces light for a long time from one spot after the excitation beam has passed on to another spot. So long as the decay time for the light is less than the frame time, no problem is created for video display applications. In our invention, the longer the trap lifetime, the longer the light persists for a given brief beam excitation and the greater the overall photon gain $G_p$ for the system. Since the beam current is limited by resolution or spot size considerations, the ability to produce more photons overall per incident beam electron is important.

In a conventional phosphor $G_p$ is given by $$G_p = \frac{E_B}{E_p} \times f \tag{6}$$

where $E_B$ is the e-beam energy, $E_p$ is the energy needed to excite a photon, and f is the escape factor for the photon. The overall phosphor electrical efficiency $\eta$ is then $$\eta = \frac{h\nu}{E_p} \times f \tag{7}$$

where $h\nu$ is the photon energy. Substituting $f/E_p = G_p/E_B$ from Eq. (6) into Eq. (7), we get $$\eta = \frac{h\nu}{E_B} \times G_p. \tag{8}$$

Since $\eta = 0.2$ in a typical phosphor, and $h\nu \simeq 2$ eV while $E_B = 30$ keV, the photon gain is typically $G_p = (0.2) \times (30,000/2) = 3000$. In contrast, a target in accordance with our invention has a photon gain $G_p'$ given by $$G_p' = \eta_{ext} G_q \eta_t \tag{9}$$

where $\eta_{ext}$ is the external quantum efficiency of the p-n junction 16 (i.e., of the LED associated with that junction), $G_q$ is the charge gain, and $\eta_t$ is the trap excitation efficiency. The LED internal quantum efficiency is close to 100%, but trapping of light reduces it significantly so that $\eta_{ext} \approx 5\%$ is a good approximation. $G_q = 10^4$ as discussed above. On the other hand, $\eta_t$ is the ratio of the beam voltage $V_B$ (in eV) to the energy $E_t$ required to produce a trap (about 1-5 eV depending on the choice of blocking layer). In a conservative vein choose $E_t = 5$ eV, then for $V_B = 30$ keV we get $\eta_t = 6 \times 10^3$ and the photon gain $G_p' = (0.05) \times (10^4) \times (6 \times 10^3) = 3 \times 10^6$. Thus, the photon gain is $10^3$ greater than that of a conventional phosphor target and allows for a large increase in brightness for a given beam current; that is, very high brightness for a given resolution.

In a preferred embodiment, p-n junction 16 is incorporated in a double heterostructure LED 80 which includes, for example, opposite conductivity type, wide bandgap layers 12 and 28 and a lattice-matched, active layer 14 interposed therebetween. Illustratively, active layer 14 comprises $Al_xGa_{1-x}As$, layer 28 comprises $Al_yGa_{1-y}As$, and layer 12 comprises $Al_zGa_{1-z}As$, with $x<y,z$. As is well known in the art, x determines the wavelength $\lambda$, and y,z are chosen large enough (e.g., 0.24-0.40) to confine injected minority carriers to the active layer 14. For $\lambda$ in the visible $x \geq 0.3$ or other semiconductors discussed later may be utilized.

In order to obtain the charge gain characteristics described above, the current-blocking layer 18 should form ohmic contacts with the layers adjacent to it. Layer 18 may comprise semi-insulating, single crystal material such as Cr-doped GaAs which has a resistivity of about $10^6$ ohm-cm, or O-doped AlGaAs which has a resistivity of about $10^8$ ohm-cm. Both of these layers are well known in the art and can be grown to the appropriate thickness by molecular beam epitaxy.

Alternatively, the current-blocking layer may be an amorphous material (e.g., hydrogenated Si) or the LED 80 may be fabricated from other, well-known lattice-matched materials such as InP-InGaAsP, for example, which generates light in the 1.0–1.6 $\mu$m range.

As mentioned previously, visible light can be obtained from other semiconductors such as GaAsP or GaP so that the display is directly visible. However, even when the light is not visible (e.g., near IR radiation generated from GaAs), the principles of our invention are still applicable. The IR light can be used indirectly to to produce visible light. For example, the IR light and the associated image can be used to control a liquid crystal cell or an image intensifier cell which produce visible images. In this case our CRT would be used indirectly for controlling the other display device. The scanning e-beam would produce a scanning IR light spot which, in turn, would control light generation in a single cell device. When the direct use of an e-beam to excite a visible light emitting material might be more efficient, the conversion from e-beam to IR light spot to visible light greatly simplifies the device and enlarges available options.

Another application for an IR device in accordance with our invention is direct writing on paper. Here, the image from the miniature CRT target would be focused onto a sheet of suitably prepared (sensitized) paper. The IR light beam would then write the image thermally or electronically on the paper.

Figure 3:
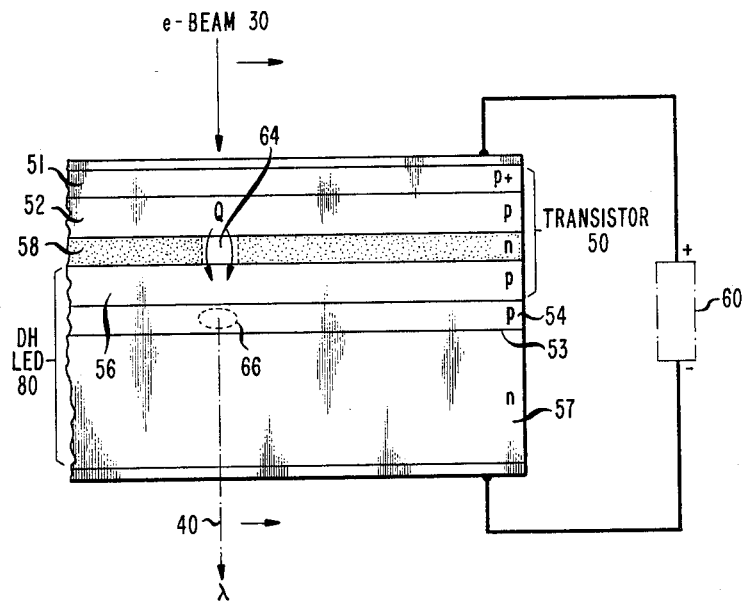
FIG. 3 is a schematic drawing of another semiconductor target, incorporating a transistor structure to provide current gain, in accordance with another embodiment of our invention.

A different mechanism for current gain may be provided by incorporating the current-blocking layer in a transistor 50 in accordance with another embodiment of our invention depicted in FIG. 3. In particular, the current-blocking layer 58 is the base of a wide area transistor 50 which is interposed between the active layer 54 and the e-beam source. The transistor 50 also includes a collector layer 56 and an emitter layer 52 as well as an optional contact-facilitating layer 51. The LED 80, as before, is preferably a double heterostructure which includes the active layer 54 sandwiched between opposite conductivity type, wide bandgap layers 57 and 56 (the latter also serves as the collector of transistor 50). The reverse biased junction between layers 56 and 58 cuts off the transistor 50 so that, in the absence of an e-beam the p-n junction 53 is not forward biased. However, when the e-beam is incident on a given spot, the electrons from the e-beam 30 are absorbed in a localized zone 64 of the base 58, thereby turning on the transistor locally. Consequently, holes flow across the base and forward bias the portion of p-n junction 53 in registration with zone 64. The resultant flow of charge causes the radiative recombination of holes and electrons in a localized source spot 66 of the active layer 54 under the e-beam 30. This source spot radiates light 40 which, as before, is scannable with the e-beam 30. In this embodiment the light persists only during the e-beam excitation.

In the embodiment of FIG. 3, the effects of lateral current spreading in transistor 50 can be alleviated by electrically isolating individual picture cells; e.g., using techniques well known in the art, the cells may be defined by suitable masking and either proton bombardment between cells or etching away material between cells, in both cases to a depth which penetrates through the current-blocking layer 58.

It is to be understood that the above-described arrangements are merely illustrative of the many possible specific embodiments which can be devised to represent application of the principle of the invention. Numerous and varied other arrangements can be devised in accordance with these principles by those skilled in the art without departing from the spirit and scope of the invention. In particular, the device of FIG. 3 employs a floating base but improvement in gain can be attained by providing an additional electrical contact directly to the base 54. Moreover, the p-n-p-n structure of FIG. 3, under appropriate operating conditions, may exhibit bistability as in a thyristor. Second, although the current-blocking layers 18 and 58 in FIGS. 1 and 3 are illustratively at different depths under the electrode 20, the e-beam 30 can still be made to have its peak absorption in the blocking layer by appropriate choice of the e-beam energy and/or the layer thickness. Third, power absorbed in the target (e.g., 5 W) may be dissipated by a suitable heat-sinking structure well-known in the art. Fourth, if light absorption in the current-blocking layer might increase its conductivity (e.g., via the photoconductive effect) and hence reduce its ability to block current, then a light-absorbing layer may be interposed between the current-blocking layer and the recombination region (i.e., the p-n junction). Finally, with a suitable resonator the LED can be adapted to operate as a laser.

What is claimed is:
1. A CRT device comprising
   a semiconductor target, and
   a source of a scannable e-beam for addressing said target, characterized in that said target includes
   a p-n junction which produces charge flow and radiative recombination when forward biased, and at least one current-blocking layer which inhibits charge flow across said junction in the absence of said e-beam being incident on said layer, said e-beam being absorbed in a localized zone of said layer so as to allow charge flow therethrough, thereby generating from said recombination a light spot which radiates from said target and which scans with said e-beam.

2. The device of claim 1 wherein said at least one current-blocking layer includes electronic traps which have a lifetime whch is much longer than the transit time of carriers across said layer.

3. The device of claim 1 wherein said at least one current-blocking layer comprises a semi-insulating semiconductor layer positioned between said junction and said source.

4. The device of claim 3 wherein said target comprises AlGaAs and said at least one current-blocking layer comprises Cr-doped GaAs.

5. The device of claim 3 wherein said target comprises AlGaAs and said at least one current-blocking layer comprises O-doped AlGaAs.

6. The device of claim 1, 2, 3, 4 or 5 wherein said target includes a double heterostructure having an active region into which said p-n junction injects charge and in which said recombination occurs.

7. The device of claim 1 wherein said target includes a normally cut-off transistor positioned between said junction and said source, said at least one current-blocking layer including the base of said transistor.

8. The device of claim 7 wherein said target includes a double heterostructure having an active region into which said p-n junction injects charge and in which said recombination occurs.

9. The device of claim 1 further including a light-absorbing layer interposed between said p-n junction and said current-blocking layer.

10. A target for use in a cathode ray tube device comprising
a plurality of semiconductor layers,
a p-n junction which injects charge and produces radiative recombination when forward biased,
at least one of said layers comprising a current-blocking layer which inhibits charge flow across said junction in the absence of an e-beam being incident thereon, said current-blocking layer forming ohmic contacts with adjacent ones of said layers, and
a localized zone of said current-blocking layer being formed when an e-beam is absorbed therein so as to allow charge flow through said zone, thereby generating from said recombination a light spot which radiates from said target and which scans with said e-beam.

11. The target of claim 10 wherein said current-blocking layer includes electronic traps which have a lifetime which is much longer than the transit time of carriers across said current-blocking layer.

12. The target of claim 10 wherein said current-blocking layer comprises a semi-insulating semiconductor layer positioned between said junction and the source of said e-beam.

13. The target of claim 10 wherein said layers form a normally cut-off transistor positioned between said junction and the source of said e-beam, the base of said transitor comprising said current-blocking layer.

14. The target of claim 10, 11, 12 or 13 wherein said layers form a double heterostructure having an active region into which said p-n junction injects charge and in which said recombination occurs.

15. The target of claim 10 further including a light-absorbing layer interposed between said p-n junction and said current-blocking layer.

* * * * *